United States Patent
Fish et al.

(10) Patent No.: US 9,338,829 B2
(45) Date of Patent: May 10, 2016

(54) HEATED PLATEN WITH IMPROVED TEMPERATURE UNIFORMITY

(71) Applicant: Varian Semiconductor Equipment Associates, Inc., Gloucester, MA (US)

(72) Inventors: Roger B. Fish, Bedford, MA (US); Steven Anella, West Newbury, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 174 days.

(21) Appl. No.: 14/180,962

(22) Filed: Feb. 14, 2014

(65) Prior Publication Data

US 2015/0237677 A1    Aug. 20, 2015

(51) Int. Cl.
*B23K 13/08* (2006.01)
*H05B 3/26* (2006.01)
*H01L 21/67* (2006.01)

(52) U.S. Cl.
CPC ............ *H05B 3/26* (2013.01); *H01L 21/67103* (2013.01)

(58) Field of Classification Search
CPC .. H01L 21/67103; H05B 1/0233; H05B 3/03; H05B 3/26
See application file for complete search history.

(56) References Cited

U.S. PATENT DOCUMENTS

| | | | |
|---|---|---|---|
| 2006/0096972 A1* | 5/2006 | Nakamura | H01L 21/67103 219/444.1 |
| 2007/0114208 A1 | 5/2007 | Takahashi | |
| 2008/0044257 A1 | 2/2008 | England et al. | |
| 2008/0076194 A1 | 3/2008 | Blake et al. | |
| 2008/0237030 A1 | 10/2008 | Aoto et al. | |
| 2011/0073780 A1 | 3/2011 | Fish et al. | |

OTHER PUBLICATIONS

International Search Report and Written Opinion Mailed May 21, 2015, in corresponding international patent application No. PCT/US2015/015310.

* cited by examiner

*Primary Examiner* — Shawntina Fuqua

(57) ABSTRACT

A heated platen with improved temperature uniformity is generally described. Various examples provide a platen portion with a metallization layer thermally coupled thereto. An electrical contact may be connected to the metallization layer and configured to conduct an electric current for heating the metallization layer and the platen portion. The electrical contact may include an electrical conductor and a resistive heating element that is configured to heat up when electric current flows therethrough, thereby creating a thermal block that reduces an amount of heat that is absorbed into the electrical contact from the platen portion.

20 Claims, 7 Drawing Sheets

HEATED PLATEN WITH IMPROVED TEMPERATURE UNIFORMITY

FIELD OF THE DISCLOSURE

Embodiments of the present disclosure generally relate to the field of substrate processing, and more particularly to high temperature platens having power contacts adapted to maintain platen temperature uniformity.

BACKGROUND OF THE DISCLOSURE

Ion implantation is a process of depositing chemical species into a substrate by direct bombardment of the substrate with energized ions. In semiconductor manufacturing, ion implanters are used primarily for doping processes that alter the type and level of conductivity of target materials. A precise doping profile in an integrated circuit (IC) substrate and its thin-film structure is important for proper IC performance. To achieve a desired doping profile, one or more ion species may be implanted in different doses and at different energies.

In some ion implantations processes, the desired doping profile is achieved by implanting ions in the target substrate at high temperatures (e.g., between 150-600° Celsius). Heating the target substrate can be achieved by supporting the substrate on a heated platen during the ion implant process. A typical heated platen may include one or more heating elements, such as a metallization layer connected to a power source via electrical contacts. During operation, these electrical contacts may absorb some of the heat from the metallization layer, effectively acting as small heat sinks that can reduce the temperature of the heated platen in localized areas adjacent to the electrical contacts. As will be appreciated, any temperature variation between portions of the heated platen may affect the uniformity of the heat transferred to the target substrate, which in turn can adversely affect the ion implantation process. In some instances, such temperature variations can cause the heated platen to warp, bow, or even crack.

In view of the foregoing, it will be understood that there is a need to ensure that heat losses via electrical connections in heated platens are minimized in order to ensure substantially uniform platen temperature.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In general, various embodiments of the present disclosure provide a heated platen with improved temperature uniformity. A first exemplary embodiment of a heated platen in accordance with the present disclosure may include a platen portion, a metallization layer associated with the platen portion, the metallization layer for selectively heating the platen portion, and an electrical contact coupled to the metallization layer for conducting electricity to the metallization layer, the electrical contact including an electrical conductor and a resistive heating element, the resistive heating element sized and configured to increase a temperature of a portion of the electrical conductor when electricity flows through the resistive heating element, thereby minimizing heat absorbed by the electrical contact from at least one of the metallization layer and the platen portion.

A second exemplary embodiment of a heated platen in accordance with the present disclosure may include a platen portion, a metallization layer associated with the platen portion, a base supporting the platen portion, a radiation shield disposed between the platen portion and the base, the radiation shield for reducing heat transfer from the platen portion to the base, and an electrical contact coupled to the metallization layer and configured to conduct an electric current for heating the metallization layer and the platen portion, the electrical contact including an electrical conductor, and a thermally conductive element disposed in contact with the radiation shield and the electrical conductor, the thermally conductive element configured to conduct heat from the radiation shield to the electrical conductor to minimize heat absorbed by the electrical contact from at least one of the metallization layer and the platen portion.

BRIEF DESCRIPTION OF THE DRAWINGS

By way of example, various embodiments of the disclosed device will now be described, with reference to the accompanying drawings, in which.

DETAILED DESCRIPTION

Embodiments of the present disclosure provide for electrical contact between a power source and a heated platen. During operation, the disclosed electrical contact arrangement may function to minimize the amount of heat absorbed from the heated platen so as to maximize temperature uniformity across the platen. As will be appreciated, the disclosed electrical contacts may be implemented in a heated platen which may be used to support a substrate during processing thereof. For example, the heated platen may be used to support a substrate during an ion implant process, a plasma deposition process, an etching process, a chemical mechanical planarization process, or generally any process where a semiconductor substrate is to be supported on a heated platen. As such, an exemplary heated platen is described. It will be appreciated, however, that the embodiments of the present disclosure are not limited by the exemplary heated platen described herein and may find application in any of a variety of other platen applications used in a variety of semiconductor manufacturing processes.

Figure 1:
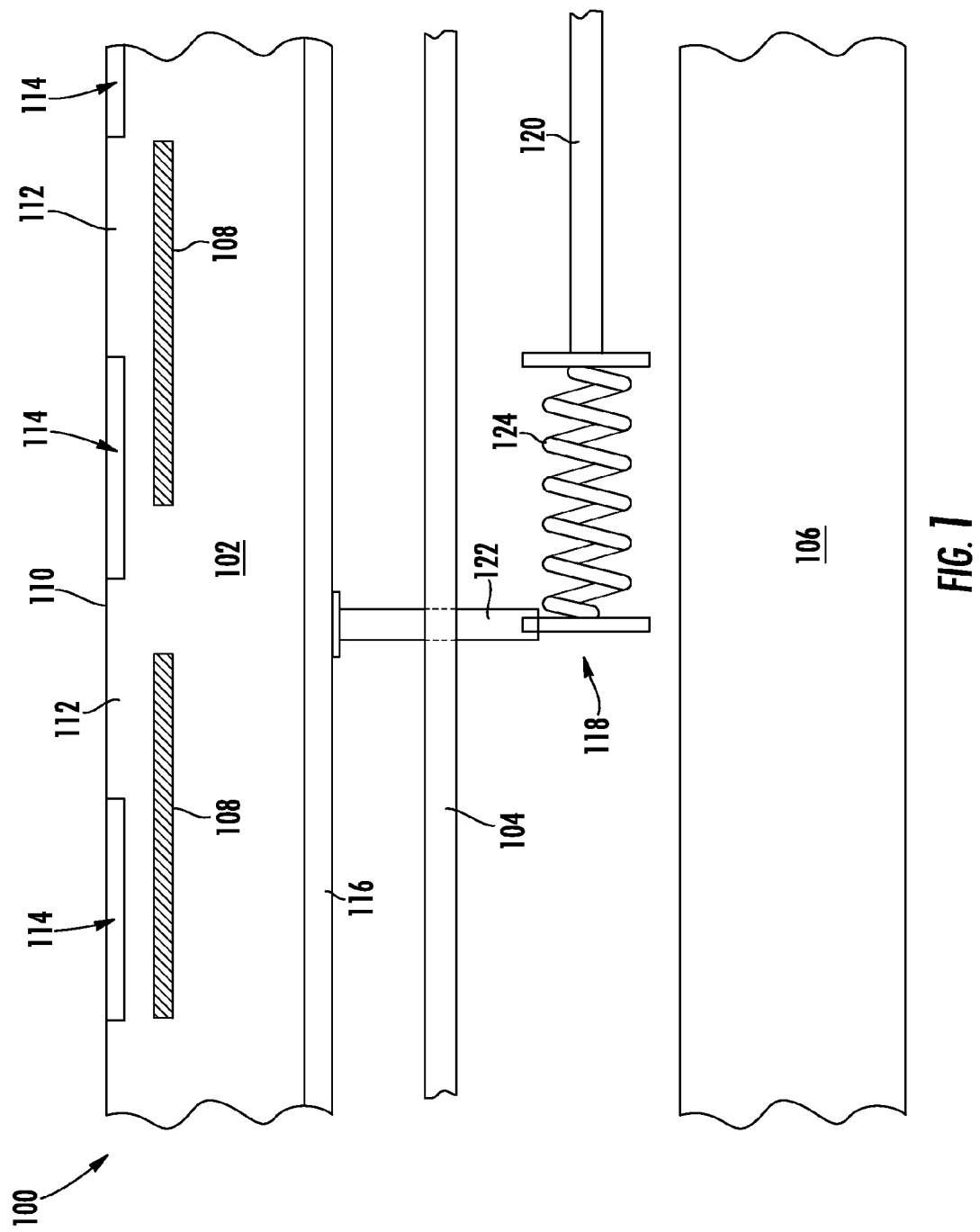
FIG. 1 is a partial cross-section view of a first exemplary heated platen in accordance with an embodiment of the present disclosure.

FIG. 1 is a partial cut-away view of an exemplary heated platen 100. The platen 100 may include a platen portion 102, a radiation shield 104, and a base 106 which may be coupled together in a vertically-spaced, stacked relationship, in any of a variety of known manners. The radiation shield 104 may function to reduce the amount of heat transferred from the platen portion 102 to the relatively cold base 106. It will be appreciated that the radiation shield may thus be configured to reflect heat back toward the platen portion 102, away from the base 106.

The platen portion 102 may be formed of an appropriate thermally durable material, including, but not limited to, a ceramic material such as alumina, aluminum nitride, boron nitride or similar dielectric ceramic. The radiation shield 104 may be formed of an appropriate thermally-reflective material, including, but not limited to, aluminum, stainless steel, titanium or other low emissivity metal. The base 106 may be part of, or it may be coupled to, a scanning mechanism (not shown) that is capable of orienting the platen portion 102 (and a substrate positioned thereon) at various angular and/or rotational positions during processing operations.

The platen portion 102 may include one or more electrodes 108 embedded therein for generating an electrostatic force for clamping a substrate (not shown) onto a support surface 110 of the platen portion. The support surface 110 of the platen portion 102 may be smooth, or it may be provided with mesa structures 112 for reducing backside contact with a substrate and for reducing the generation of backside particles. The support surface 110 of the platen portion 102 may additionally be provided with a plurality of cavities or interface regions 114 that may create gaps between the support surface 110 and a substrate mounted thereon. These interface regions 114 may, in some embodiments, be supplied with a gas for improving or adjusting thermal contact between the platen portion 102 and a substrate mounted thereon.

A metallization layer 116 may be disposed on a backside (underside in FIG. 1) of the platen portion 102 for heating the platen portion as will be further described below. The metallization layer 116 may include a plurality of metallic traces that may be printed on or otherwise applied to the backside of the platen portion 102 and covered with a layer of glass or other electrically insulating material. When an electric current is applied to the metallization layer 116 it may convert an amount of the electrical energy into heat which may be conducted through the platen portion 102, thereby heating a substrate disposed therein. The electric current may be supplied to the metallization layer 116 by an electrical contact 118 that is connected to an electrical power supply (not shown). While only one electrical contact 118 is shown in FIG. 1, it will be understood that the platen 100 may be provided with a number of additional, substantially similar electrical contacts for supplying the metallization layer 116 with electric current via a plurality of connection points. Generally, at least two electrical contacts should be provided to facilitate the flow of current through the metallization layer 116.

The electrical contact 118 may include first and second low resistance electrical conductors (e.g., copper or nickel wires) 120, 122 that may be coupled to one another by a resistive heating element 124 disposed below the radiation shield 104. The resistive heating element 124 may be formed of an electrically conductive material having a relatively higher electrical resistance than the first and second electrical conductors 120, 122. In one non-limiting example, the resistive heating element 124 may be a conductive coil, which in one non-limiting exemplary embodiment is a Nichrome coil. The resistive heating element 124 may be adapted to convert an amount of electric current supplied by the first electrical conductor 120 into heat, thereby increasing the temperature of the resistive heating element 124 and the second electrical conductor 122. A remainder of the electric current may flow through the resistive heating element 124 and into the second electrical conductor 122 to heat the metallization layer 116 and the platen portion 102.

The illustrated embodiment shows the resistive heating element 124 positioned in a horizontal arrangement (i.e., an axis of the resistive heating element being generally parallel to the plane of the platen portion 102 and radiation shield 104). It will be appreciated that this orientation is not critical, and that instead the resistive heating element could instead be position perpendicular to the plane of the platen portion 102 and radiation shield 104, or it could be oriented at an oblique angle thereto. Similar variations in the orientation of the resistive heating element will also be applicable to the alternative embodiments disclosed herein.

As described above, the resistive heating element 124 may be formed as a coil for maximizing a length of the resistive heating element 124 in a given amount of space. Such a coil may have an air core as shown in FIG. 1, or may be provided with a mechanically supportive core, such as may be formed of a dielectric material. It will be appreciated that the resistive heating element 124 may be implemented using numerous other structures and configurations that may be similarly adapted to convey an electric current while converting an amount of the current into heat. For example, the resistive heating element 124 may alternatively be embodied by a block, strip, or mesh of electrically resistive material. Many other embodiments are contemplated and may be implemented without departing from the present disclosure.

During operation of the platen 100, electric current may be applied to the metallization layer 116 via the electrical contact 118, thereby heating the metallization layer 116 and the platen portion 102 in the manner described above. Simultaneously, the electric current in the electrical contact 118 may heat the resistive heating element 124 to a predetermined temperature or temperature range. For example, the resistive heating element 124, or at least a portion thereof, may be heated to a temperature that approaches the temperature of the heated platen portion 102 (e.g., 150-600° Celsius). In one non-limiting embodiment, the resistive heating element 124 may be configured to be heated to a temperature that is within 100 degrees Celsius of a temperature of the platen portion 102 when the platen portion 102 is heated. It will be appreciated that the exact temperature of the heated resistive heating element 124 will depend on the geometry and material of the resistive heating element 124 as well as the amount of electric current that is applied to the resistive heating element 124. Heated thusly, the resistive heating element 124 may create a thermal block that increases the temperature of the second electrical conductor 122 to a temperature approaching or equaling that of the platen portion 102, thus minimizing or eliminating absorption of heat from the platen portion into the electrical contact 118. As will be appreciated, this may provide the platen portion 102 with better temperature uniformity by preventing, or at least reducing the severity of, cold spots that may otherwise form in the platen portion 102 in areas adjacent to the electrical contact 118 if the electrical contact 118 were significantly colder than the heated platen portion 102.

It is contemplated that the above-described platen 100 may be implemented using a variety of alternative configurations without departing from the scope of the present disclosure. For example, referring to FIG. 2, a block diagram showing a partial cut-away view of an alternative heated platen 200 in accordance with the present disclosure is illustrated. The platen 200 may have some or all of the features described in relation to the platen 100 of FIG. 1, with like elements bearing similar reference numbers, preceded by the number "2." The platen 200 differs from the platen 100, however, in that the electrical contact 218 (including first and second electrical conductors 220, 222, and resistive heating element 224) of the platen 200 is located between the radiation shield 204 and the platen portion 202, whereas the resistive heating element 124 of the platen 100 is positioned between the radiation shield 104 and the base 106. By disposing the electrical contact 218, first and second electrical conductors 220, 222 and resistive heating element 224 between the radiation shield 204 and the platen portion 202, the resistive heating element 224 may be sized slightly smaller (as compared to the embodiment of FIG. 1) because it will be positioned in a relatively higher temperature region formed between the radiation shield and the platen portion.

Figure 3:
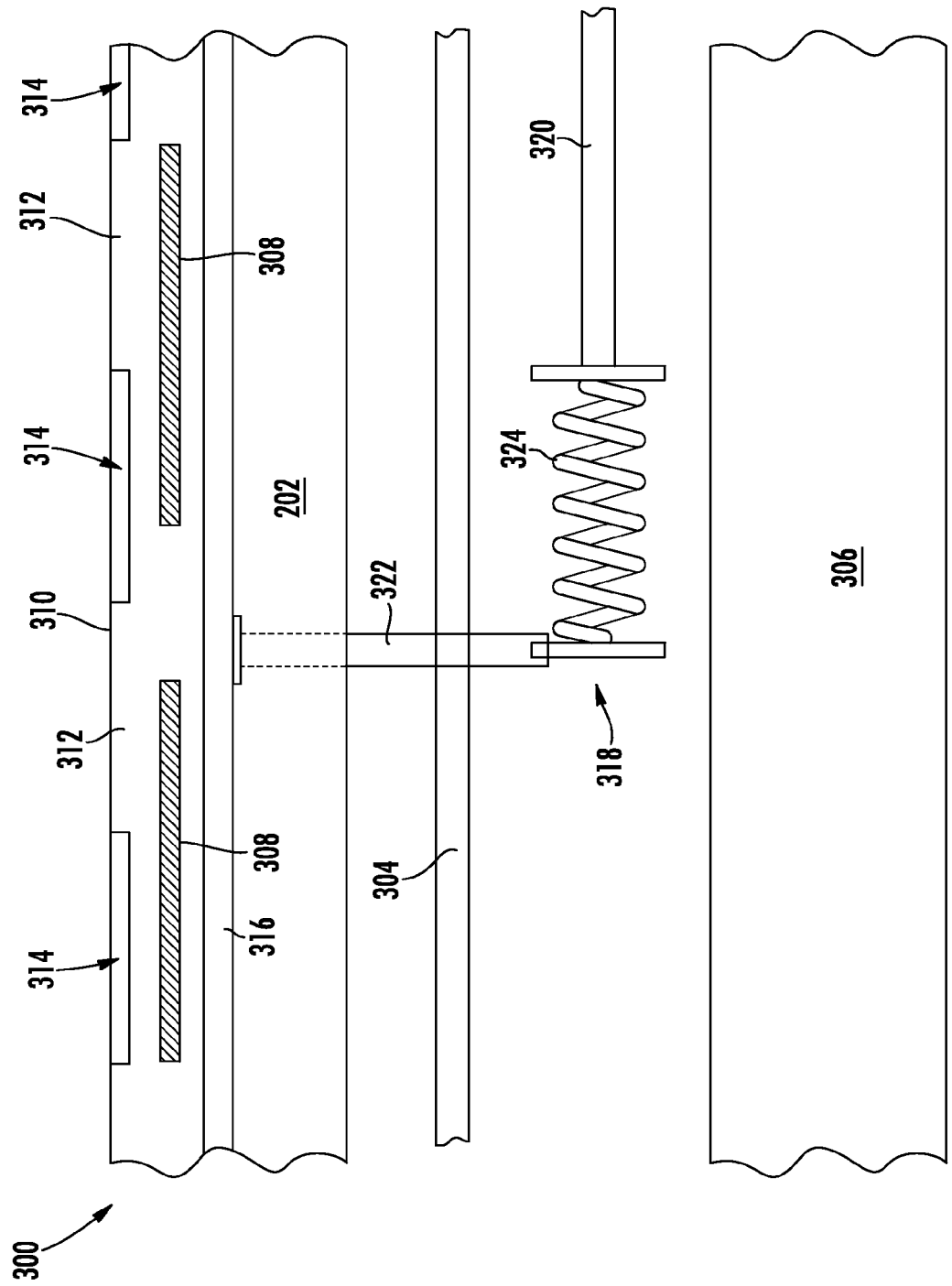
FIG. 3 is a partial cross-section view of a third exemplary heated platen in accordance with an embodiment of the present disclosure.

Referring to FIG. 3, a block diagram showing a partial cut-away view of another alternative heated platen 300 in accordance with the present disclosure is illustrated. The platen 300 may have some or all of the features described in relation to the platen 100 of FIG. 1, with like elements bearing similar reference numbers, preceded by the number "3." The platen 300 differs from the platen 100 (and also platen 200) in that the metallization layer 316 in this embodiment is embedded within the platen portion 302. This arrangement may be achieved by sandwiching the metallization layer 316 between two separate layers of dielectric material (e.g., alumina). This configuration provides an advantage relative to the backside metallization layers 116 and 216 of the platens 100 and 200 in that the metallization layer 316 is located nearer the support surface 310 of the platen portion 302 and may therefore heat the support surface 310 more efficiently (i.e., with less heat dispersed throughout the platen portion 302 before reaching the support surface 310).

Figure 4:
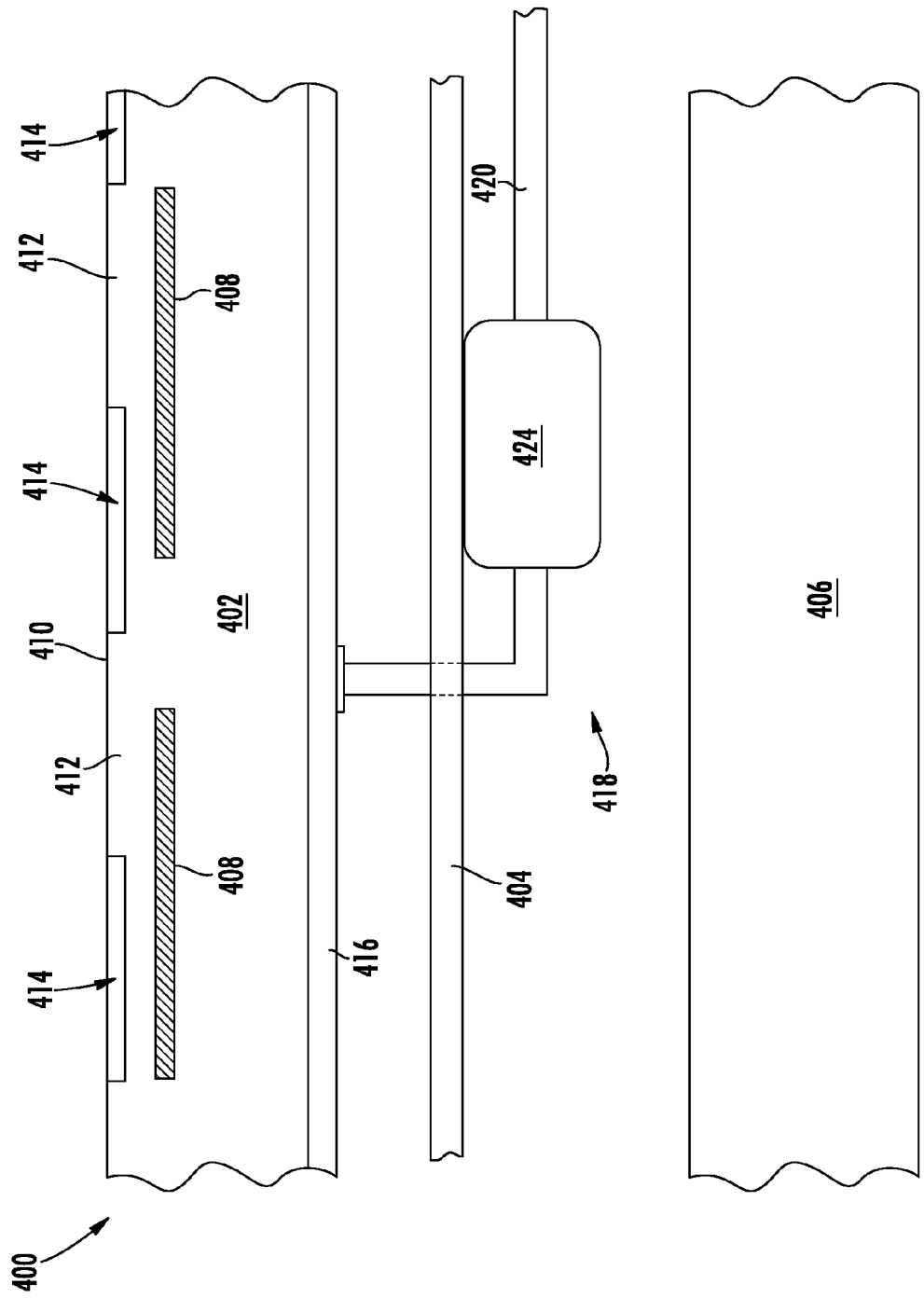
FIG. 4 is a partial cross-section view of a fourth exemplary heated platen in accordance with an embodiment of the present disclosure.

FIG. 4 illustrates a block diagram showing a cutaway view of a portion of an exemplary heated platen 400. The heated platen 400 of this embodiment may be similar to the heated platen 100 described in relation to FIG. 1, with like elements bearing similar reference numbers, preceded by the number "4." As depicted, the platen 400 may include a platen portion 402, a radiation shield 404, and a base 406 which may be coupled together in a vertically-spaced, stacked relationship, such as with mechanical fasteners (not shown). The radiation shield 404 may insulate the hot platen portion 402 and may prevent or reduce the migration of heat from the platen portion 402 to the cold base 406. The platen portion 402 may be formed of an appropriate thermally conductive material, including, but not limited to, alumina. The radiation shield 404 may be formed of an appropriate thermally-reflective material, including, but not limited to, aluminum. The base 406 may be part of, or coupled to, a scanning mechanism (not shown) for facilitates various angular and/or rotational movements of the platen portion 402 during processing operations.

The platen portion 402 may have electrodes 408 embedded therein for generating an electrostatic force that may hold a substrate (not shown) onto a support surface 410 of the platen portion 402. The support surface 410 of the platen portion 402 may be smooth, or it may be provided with mesa structures 412 for reducing backside contact with a substrate and reducing the generation of backside particles. The support surface 410 of the platen portion 402 may additionally be provided with a plurality of cavities or interface regions 414 that may create gaps between the support surface 410 and a platen mounted thereon. These interface regions 414 may, in some embodiments, be supplied with a gas for improving or adjusting thermal contact between the platen portion 402 and a substrate.

A metallization layer 416 may be disposed on a backside (underside in FIG. 4) of the platen portion 402 for heating the platen portion as further described below. The metallization layer 416 may include a plurality of metallic traces that may be printed on or otherwise applied to the backside of the platen portion and covered with a layer of glass or other electrically insulating material. When an electric current is applied to the metallization layer 416 it may convert an amount of the electrical energy into heat which may be radiated into and through the platen portion 402, thereby heating a substrate disposed therein. The electric current may be supplied to the metallization layer 416 by an electrical contact 418 that is connected to an electrical power supply (not shown). While only a single electrical contact 418 is shown in the partial view of FIG. 4, it will be understood that the platen 400 may be provided with a number of additional, substantially similar electrical contacts for supplying the metallization layer 416 with electric current via a plurality of connection points.

The electrical contact 418 may include a low resistance electrical conductor (e.g., a copper or nickel wire) 420 that may pass through a thermally conductive element 424 that may be disposed below, and in contact with, the radiation shield 404. The thermally conductive element 424 may be formed of a material having a high thermal conductivity and a low electrical conductivity. In one non-limiting example, the thermally conductive element 424 may be a block of alumina. Thus arranged, the thermally conductive element 424 may absorb heat from the radiation shield 404 and may conduct that heat to the electrical conductor 420, thereby increasing the temperature of portions of the electrical conductor 420 that are in proximity to the thermally conductive element 424. By increasing the temperature of the electrical conductor 420, heat absorption from the platen 400 to the electrical contact 418 can be minimized or eliminated.

As described above, the thermally conductive element 424 may be formed of a block of alumina that surrounds the electrical conductor 420 in the manner of a sleeve. It will be appreciated that the thermally conductive element 424 may be implemented using numerous other structures and configurations that may be similarly adapted to convey an amount of heat from the radiation shield 404 to the electrical conductor 420. For example, the electrical conductor 420 may be adhered to an outer surface of the thermally conductive element 424 (e.g., with thermally conductive paste) instead of passing through the thermally conductive element 424. Alternatively, the thermally conductive element 424 may be embodied by a wire, strip, or mesh of thermally conductive, electrically insulating, material that connects the electrical conductor 420 to the thermally radiation shield 404. Many other embodiments are contemplated and may be implemented without departing from the present disclosure.

During operation of the platen 400, electric current may be applied to the metallization layer 416 via the electrical contact 418, thereby heating the metallization layer 416 and the platen portion 402 in the manner described above. A backside of the platen portion 402 may radiate heat, a portion of which may be absorbed by the radiation shield 404. Owing to the contact between the two elements, some of this heat may be transmitted to the thermally conductive element 424 and conducted to the electrical conductor 420 in the manner described above, thereby heating a portion of the electrical conductor 420 to a predetermined temperature or temperature range. For example, a portion of the electrical conductor 420 may be heated to a temperature that approaches the temperature of the heated platen portion 402 (e.g., 150-600° Celsius). It will be appreciated that the exact temperature of the heated portion of the electrical conductor 420 will depend on the geometry and material of the electrical conductor 420 and the thermally conductive element 424, as well as the amount of heat radiated by the platen portion 402.

Because the heated portion of the electrical conductor 420 may approach the temperature of the platen portion 402, the amount of heat that is absorbed into the electrical contact 418 from the platen portion may be reduced, minimized or eliminated. As will be appreciated, this may enhance the temperature uniformity of the platen portion 402 by minimizing or eliminating cold spots that may otherwise form in the platen portion 402 in areas adjacent to the electrical contact 418 if the electrical contact 418 were significantly colder than the heated platen portion 402.

It is contemplated that the above-described platen 400 may be implemented using a variety of alternative configurations without departing from the scope of the present disclosure. For example, referring to FIG. 5, a block diagram showing a partial cut-away view of an alternative heated platen 500 in accordance with the present disclosure is illustrated. The heated platen 500 of this embodiment may be similar to the heated platen 400 described in relation to FIG. 4, with like elements bearing similar reference numbers, preceded by the number "5." The platen 500 differs from the platen 400 in that thermally conductive element 424 of the platen 500 is located above the radiation shield 204, whereas the thermally conductive element 424 of the platen 400 is located below the radiation shield 404.

Figure 5:
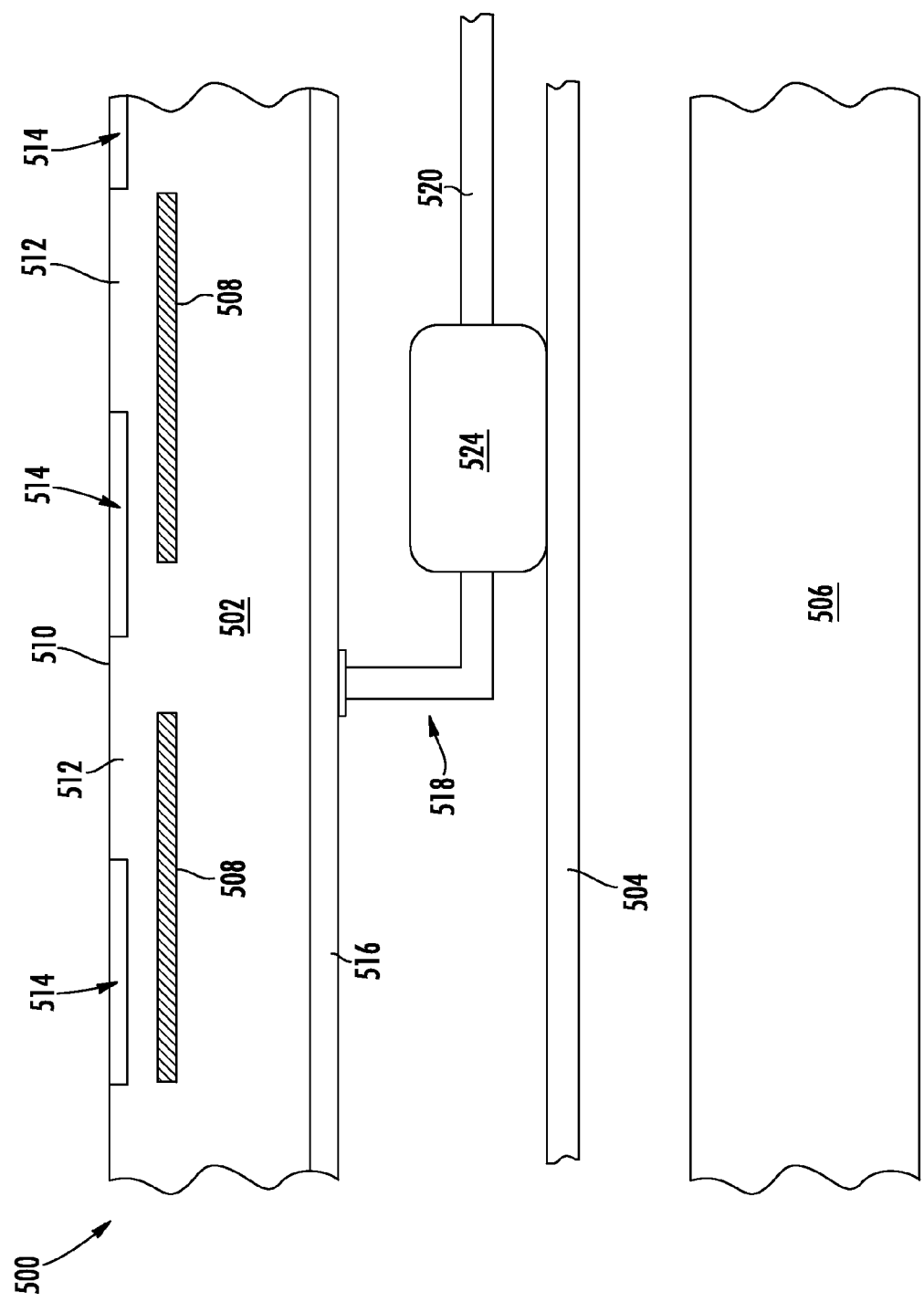
FIG. 5 is a partial cross-section view of a fifth exemplary heated platen in accordance with an embodiment of the present disclosure.
Figure 6:
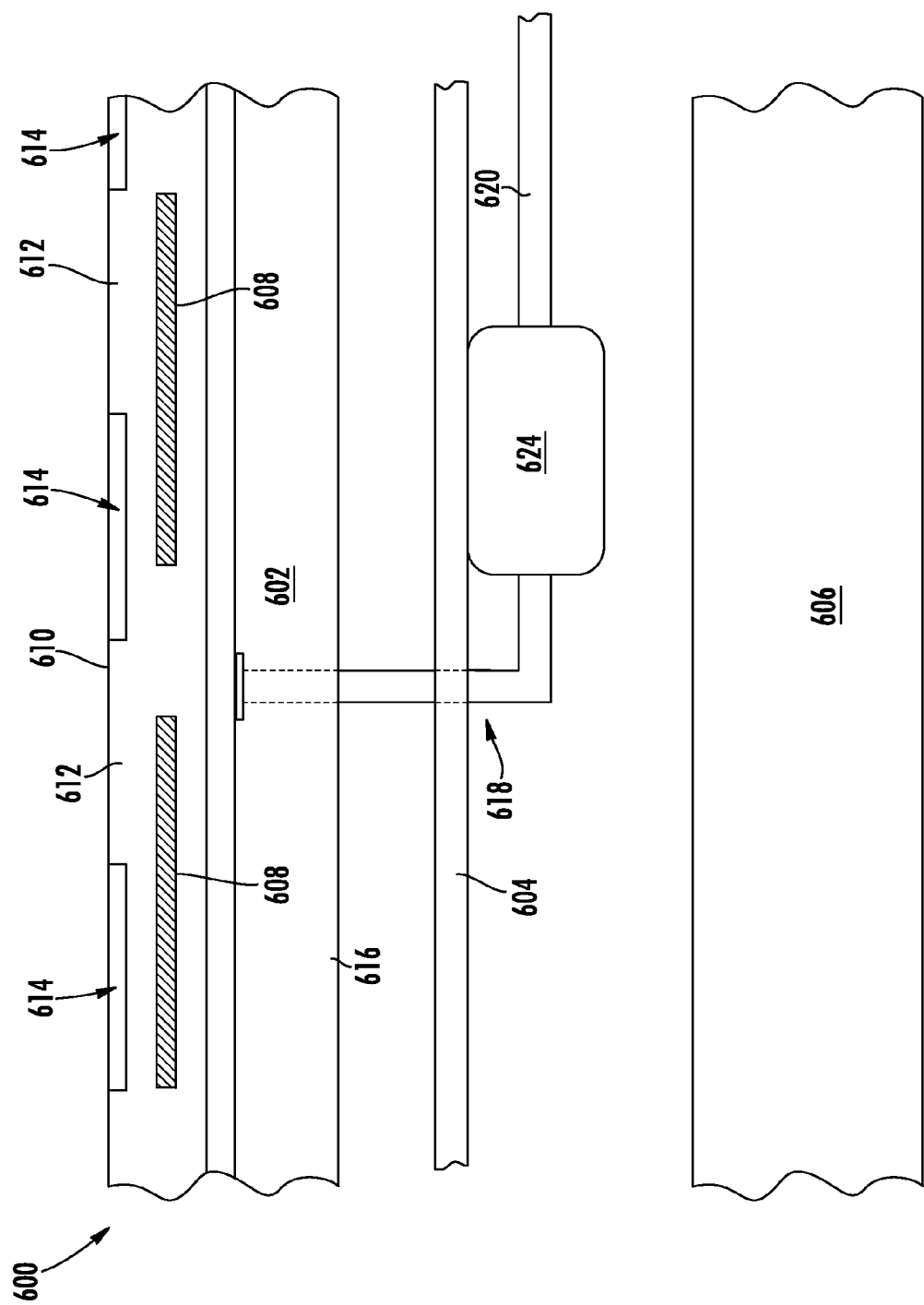
FIG. 6 is a partial cross-section view of a sixth exemplary heated platen in accordance with an embodiment of the present disclosure.

Referring to FIG. 6, a block diagram showing a partial cut-away view of another alternative heated platen 600 in accordance with the present disclosure is illustrated. The heated platen 600 of this embodiment may be similar to the heated platens 400 and 500 described in relation to FIGS. 4 and 5, with like elements bearing similar reference numbers, preceded by the number "6." The platen 600 differs from the platens 400 and 500 in that the metallization layer 616 is embedded within the platen portion 602. This may be achieved by sandwiching the metallization layer 616 between two separate layers of dielectric material (e.g., alumina). This configuration provides an advantage relative to the backside metallization layers 416 and 516 of the platens 400 and 500 in that the metallization layer 616 is located nearer the support surface 610 of the platen portion 602 and may therefore heat the support surface 610 more efficiently (i.e., with less heat dispersed throughout the platen portion 602 before reaching the support surface 610).

Figure 7:
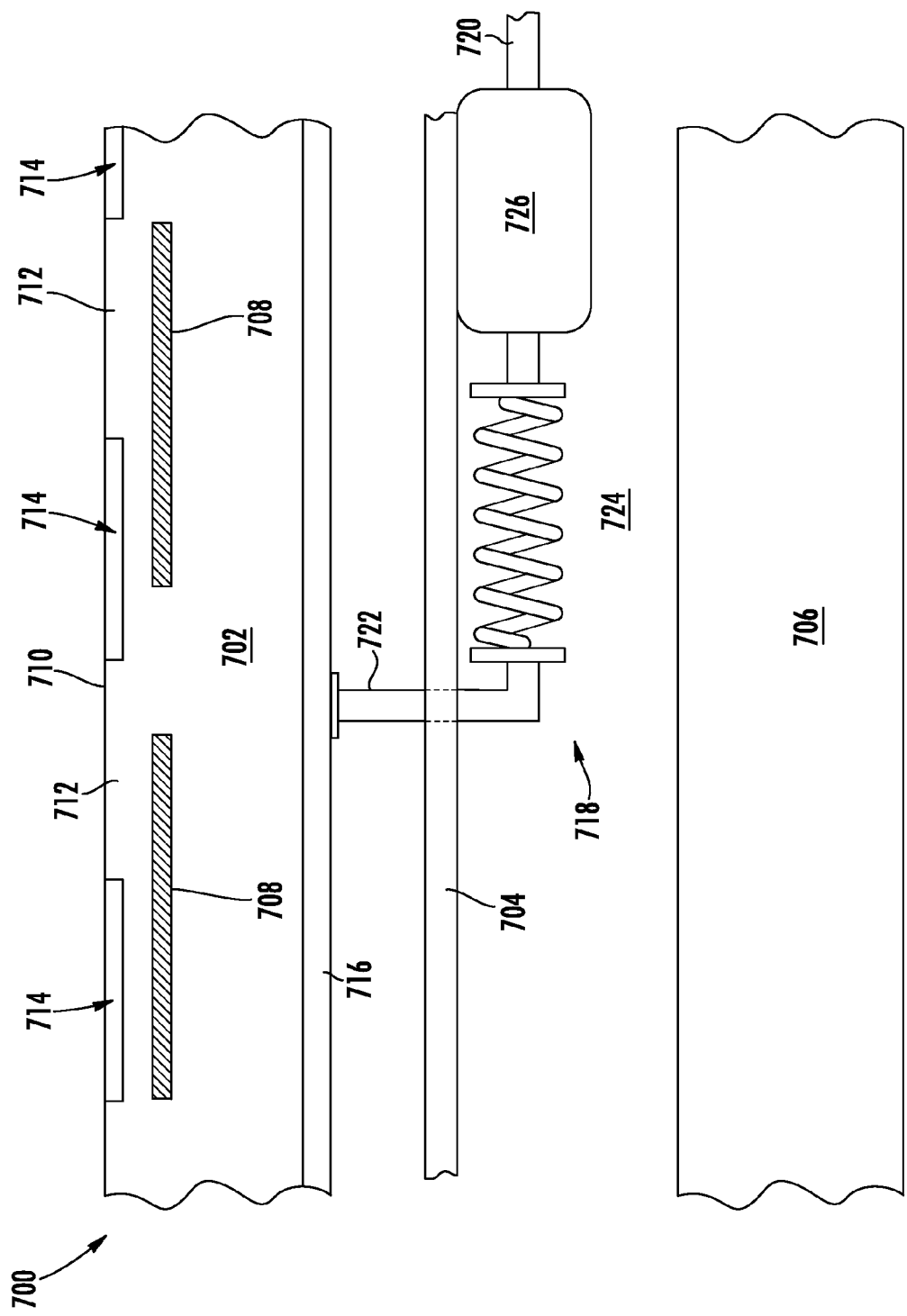
FIG. 7 is a partial cross-section view of a seventh exemplary heated platen in accordance with an embodiment of the present disclosure.

FIG. 7 illustrates a block diagram showing a cutaway view of a portion of an exemplary heated platen 700. The heated platen 700 of this embodiment may be similar to the heated platens 100 and 400 described in relation to FIGS. 1 and 4 (again, with like elements bearing similar reference numbers, preceded by the number "7.") As depicted, the platen 700 may include a platen portion 702, a radiation shield 704, and a base 706 which may be coupled together in a vertically-spaced, stacked relationship, such as with mechanical fasteners (not shown). The radiation shield 704 may insulate the hot platen portion 702 and may prevent or reduce the migration of heat from the platen portion 702 to the relatively cold base 706. The platen portion 702 may be formed of an appropriate thermally conductive material, including, but not limited to, alumina. The radiation shield 704 may be formed of an appropriate thermally-reflective material, including, but not limited to, aluminum. The base 706 may be formed of an appropriately rigid and thermally resistant material and may be coupled to a scanner mechanism (not shown) that facilitates various angular and/or rotational movements of the platen 700.

The platen portion 702 may have electrodes 708 embedded therein for generating an electrostatic force that may hold a substrate (not shown) onto a support surface 710 of the platen portion 702. The support surface 710 of the platen portion 702 may be smooth, or it may be provided with mesa structures 712 for reducing backside contact with a substrate and reducing the generation of backside particles. The support surface 710 of the platen portion 702 may additionally be provided with a plurality of cavities or interface regions 714 that may create gaps between the support surface 710 and a platen mounted thereon. These interface regions 714 may, in some embodiments, be supplied with a backside gas for improving or adjusting thermal contact between the platen portion 702 and a substrate.

A metallization layer 716 may be disposed on a backside (underside in FIG. 7) of the platen portion 702 for heating the platen portion 702 as further described below. The metallization layer 716 may include a plurality of metallic traces that may be printed on or otherwise applied to the backside of the platen portion 702 and covered with a layer of glass or other electrically insulating material. When an electric current is applied to the metallization layer 716 it may convert an amount of the electrical energy into heat which may be radiated into and through the platen portion 702, thereby heating a substrate disposed therein. The electric current may be supplied to the metallization layer 716 by an electrical contact 718 that is connected to an electrical power supply (not shown). While only one electrical contact 718 is shown in the partial view of FIG. 7, it will be understood that the platen 700 may be provided with a number of additional, substantially similar electrical contacts for supplying the metallization layer 716 with electric current via a plurality of connection points.

The electrical contact 718 may be a hybrid of the electrical contacts 118 and 418 described above and may include first and second low resistance electrical conductors (e.g., copper or nickel wires) 720, 722 that may be coupled to one another by a resistive heating element 724 disposed below the radiation shield 704. The second electrical conductor 722 may pass through a thermally conductive element 726 that may be disposed below, and in contact with, the radiation shield 704. The resistive heating element 724 may be substantial identical to the resistive heating element 124 described above, and the thermally conductive element 726 may be substantially identical to the thermally conductive element 424 described above.

During operation of the platen 700, electric current may be applied to the metallization layer 716 via the electrical contact 718, thereby heating the metallization layer 716 and the platen portion 702 in the manner described above. Simultaneously, the electric current in the electrical contact 718 may heat the resistive heating element 724 to a predetermined temperature or temperature range as described above, and the thermally conductive element 726 may conduct heat from the radiation shield 704 to a portion of the second electrical conductor 722 as described above. Heated thusly, the resistive heating element 724 and the second electrical conductor 722 may create a thermal block that mitigates the amount of heat that is absorbed into the electrical contact 718 from the platen portion 702. This may provide the platen portion 702 with better temperature uniformity by preventing, or at least reducing the severity of, cold spots that may otherwise form in the platen portion 702 in areas adjacent to the electrical contact 718 if the electrical contact 718 were significantly colder than the heated platen portion 702.

Figure 2:
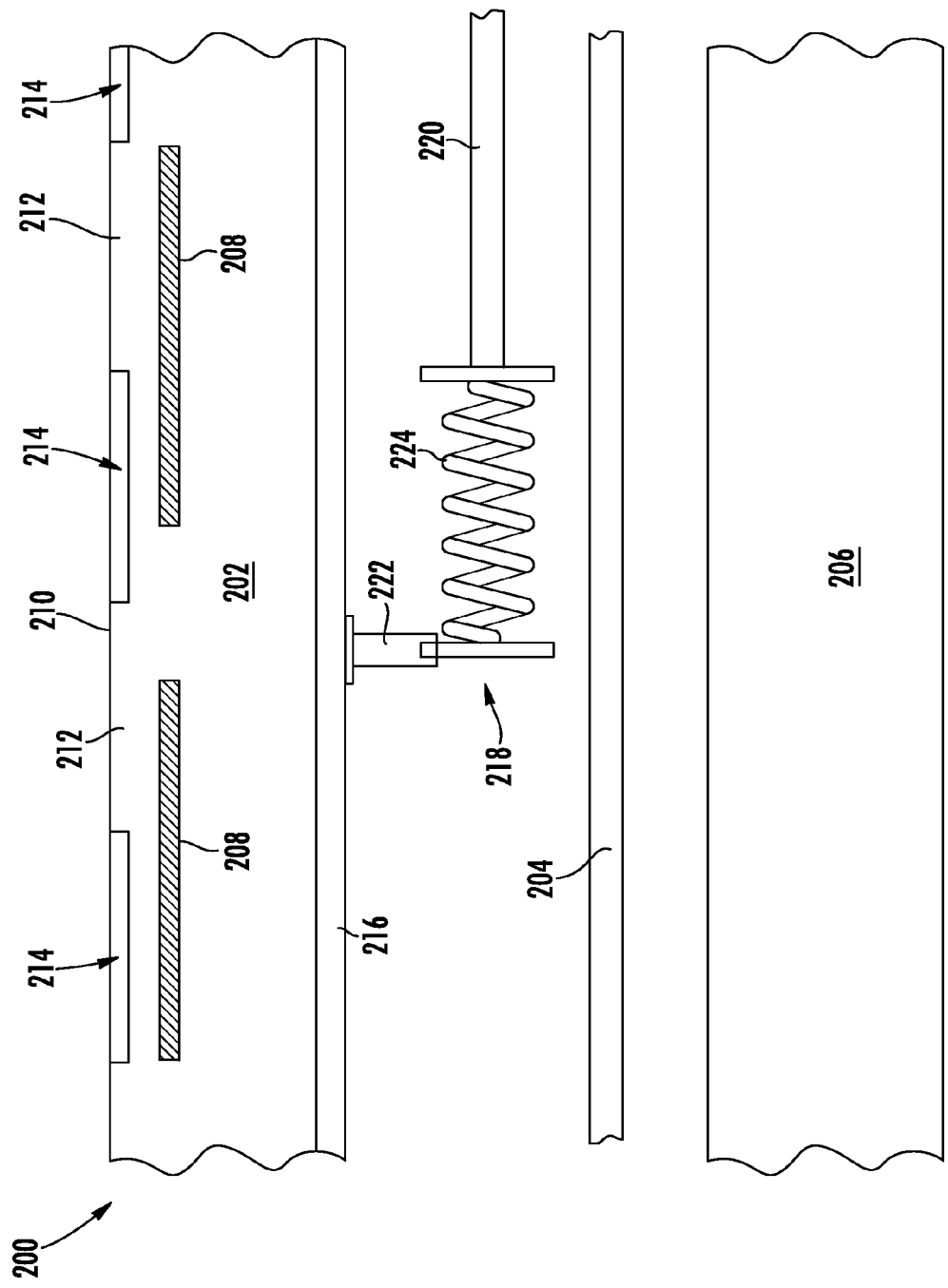
FIG. 2 is a partial cross-section view of a second exemplary heated platen in accordance with an embodiment of the present disclosure.

It is contemplated that the above-described platen 700 may be implemented using a variety of alternative configurations without departing from the scope of the present disclosure. For example, one or both of the resistive heating element 724 and the thermally conductive element 726 may be located above the radiation shield 704 as shown in FIGS. 2 and 5. Alternatively or additionally, the metallization layer 716 may be embedded within the platen portion 702 as shown in FIGS. 3 and 6.

As used herein, an element or step recited in the singular and proceeded with the word "a" or "an" should be understood as not excluding plural elements or steps, unless such exclusion is explicitly recited. Furthermore, references to "one embodiment" of the present disclosure are not intended to be interpreted as excluding the existence of additional embodiments that also incorporate the recited features.

The present disclosure is not to be limited in scope by the specific embodiments described herein. Indeed, various other embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A heated platen, comprising:
a platen portion;
a metallization layer associated with the platen portion, the metallization layer for selectively heating the platen portion; and
an electrical contact coupled to the metallization layer for conducting electricity to the metallization layer, the electrical contact comprising:
an electrical conductor; and
a resistive heating element, the resistive heating element sized and configured to increase a temperature of a portion of the electrical conductor when electricity flows through the resistive heating element, thereby minimizing heat absorbed by the electrical contact from at least one of the metallization layer and the platen portion.

2. The heated platen of claim 1, wherein the metallization layer is disposed on a backside of the platen portion.

3. The heated platen of claim 1, wherein the metallization layer is embedded within the platen portion.

4. The heated platen of claim 1, wherein the resistive heating element is a metallic coil.

5. The heated platen of claim 1, wherein the resistive heating element is configured to be heated to a temperature that is within 100 degrees Celsius of a temperature of the platen portion when the platen portion is heated.

6. The heated platen of claim 1, wherein the electrical conductor comprises a first electrical conductor and a second electrical conductor that are coupled to one another by the resistive heating element.

7. The heated platen of claim 1, further comprising a base that supports the platen portion and the metallization layer.

8. The heated platen of claim 7, further comprising a radiation shield disposed between the platen portion and the base, the radiation shield configured to reduce heat transfer from the platen portion to the base.

9. The heated platen of claim 8, wherein the electrical contact further comprises a thermally conductive element disposed in contact with the radiation shield and with a portion of the electrical conductor, the thermally conductive element configured to conduct heat from the radiation shield to the electrical conductor.

10. The heated platen of claim 9, wherein the thermally conductive element is a block of thermally conductive material that surrounds the electrical conductor and abuts the radiation shield.

11. A heated platen with improved temperature uniformity comprising:
a platen portion;
a metallization layer associated with the platen portion;
a base supporting the platen portion;
a radiation shield disposed between the platen portion and the base, the radiation shield for reducing heat transfer from the platen portion to the base; and
an electrical contact coupled to the metallization layer and configured to conduct an electric current for heating the metallization layer and the platen portion, the electrical contact comprising:
an electrical conductor; and
a thermally conductive element disposed in contact with the radiation shield and the electrical conductor, the thermally conductive element configured to conduct heat from the radiation shield to the electrical conductor to minimize heat absorbed by the electrical contact from at least one of the metallization layer and the platen portion.

12. The heated platen of claim 11, wherein the metallization layer is disposed on a backside of the platen portion.

13. The heated platen of claim 11, wherein the metallization layer is embedded within the platen portion.

14. The heated platen of claim 11, wherein the thermally conductive element is a block of thermally conductive material that surrounds the electrical conductor and abuts the radiation shield.

15. The heated platen of claim 11, wherein the thermally conductive element is configured to heat a portion of the electrical conductor to a temperature that is within 100 degrees Celsius of a temperature of the platen portion when the platen portion is heated.

16. The heated platen of claim 11, wherein the electrical contact further comprises a resistive heating element that is configured to increase in temperature when the electric current flows therethrough, thereby reducing an amount of heat that is absorbed into the electrical contact from the platen portion.

17. The heated platen of claim 16, wherein the resistive heating element is a metallic coil.

18. The heated platen of claim 16, wherein the electrical conductor comprises a first electrical conductor and a second electrical conductor that are coupled to one another by the resistive heating element.

19. The heated platen of claim 11, wherein the platen portion and the thermally conductive element are disposed on a same side of the radiation shield.

20. The heated platen of claim 11, wherein the platen portion and the thermally conductive element are disposed on different sides of the radiation shield.

* * * * *